United States Patent [19]

Aronowitz et al.

[11] Patent Number: 4,985,717
[45] Date of Patent: Jan. 15, 1991

[54] MOS MEMORY CELL WITH EXPONENTIALLY-PROFILED DOPING AND OFFSET FLOATING GATE TUNNEL OXIDATION

[75] Inventors: Sheldon Aronowitz, San Jose; Donald D. Forsythe, Palo Alto; George P. Walker, Capitola; Bhaskar V. S. Gadepally, San Jose, all of Calif.

[73] Assignee: National Semiconductor, San Diego, Calif.

[21] Appl. No.: 313,648

[22] Filed: Feb. 21, 1989

[51] Int. Cl.⁵ .......................................... H01L 29/78
[52] U.S. Cl. ...................................... 357/23.5; 357/54; 357/90; 357/91; 357/23.3
[58] Field of Search ................... 357/23.5, 90, 91, 42, 357/23.3, 54

[56] References Cited

U.S. PATENT DOCUMENTS 4,878,101 11/1989 Hsieh et al. ..................... 357/23.5

FOREIGN PATENT DOCUMENTS 58-112370 7/1983 Japan ............................ 357/23.5

Primary Examiner—Andrew J. James
Assistant Examiner—Xuan Hung Dang
Attorney, Agent, or Firm—Brown, Martin, Haller & McClain

[57] ABSTRACT

A semiconductor memory device having a CMOS memory cell with a floating gate and increasing concentration of dopant in the source, drain and channel regions. Typically the concentration profile is generally exponential across the channel width. The device has relatively high diffusion current densities accelerated toward the surface and directed toward the channel/drain interface. Gate oxidation thickness is reduced over the channel near the drain to create a tunnel "window" in the area of greatest electric field magnitude. The device provides for significantly reduced write times as compared to conventional devices.

9 Claims, 2 Drawing Sheets

MOS MEMORY CELL WITH EXPONENTIALLY-PROFILED DOPING AND OFFSET FLOATING GATE TUNNEL OXIDATION

BACKGROUND OF THE INVENTION

This invention is in the field of electronically programmable semiconductor memories of the EPROM or EEPROM type.

Non-volatile, programmable memory storage is provided in CMOS technology through the conventional EPROM (electrically programmable ROM) and EEPROM (electrically erasable PROM) structures. Examples of these structures are given by D. G. Ong in Chapter 9 of MODERN MOS TECHNOLOGY, McGraw-Hill, 1984, at pages 212–216. Each device incorporates a conventional CMOS (complementary metal-oxide silicon) structure in which an intrinsically p-conducting substrate has diffused n-type source and drain regions, between which lies a channel region. A control gate is formed on the semiconductor substrate and spans the channel region between the source and drain regions. The gate is electrically insulated from the substrate by a gate oxide sandwiched between the gate and the substrate surface.

The EPROM structure includes a floating gate located between the channel region and the control gate, and insulated from the control gate by a first layer of gate oxide and from the channel region by a second layer of gate oxide. This EPROM cell is "written" by application of a relatively high positive voltage to the drain region and a higher relatively positive voltage to the control gate. The drain voltage accelerates electrons in the channel region, while the high gate voltage provides channel region electrons with enough energy to be injected across the second gate oxide layer separating the floating gate from the channel. Writing collects or captures channel electrons in the floating gate, which raises the voltage threshold required to make the channel region conductive above that when the floating gate has no channel electrons. Such a cell is referred to as a "written" cell. Conventional CMOS circuitry references a "written" cell as storage of a digital value of "1". An unwritten cell is considered to indicate a data storage value of a digital "0".

In the typical EEPROM cell, a floating gate spans the channel region and extends over the drain region. In the channel region, the oxide layer insulating the floating gate from the substrate surface has a thickness corresponding to the thickness of an EPROM gate oxide layer. However, the gate oxide layer under the portion of the floating gate overlying the drain region is made substantially thinner. The thin oxide layer is referred to as a "tunnel oxide layer" to denote the tunneling mechanism by which electrons are injected through the layer into the floating gate from the drain region and extracted from the floating gate by the drain region, according to the cell biasing. See Ong at pages 213 and 216.

As is known, relatively high voltages and relatively long writing times are required by prior art EPROM structure in order to "write" a cell. Further, the classical EPROM structure requires extraordinary methods to erase a cell. For example, the prior art teaches EPROM erasure by exposure of the memory cell to UV light for a long period of time. The EEPROM structure was developed in an effort to provide relatively faster writing at relatively lower voltages, together with an ability to erase a written cell in situ.

The thrust of development in CMOS non-volatile memory cell technology has been to reduce voltage levels required for operating these devices, thereby enhancing the efficiency of cell operation, and to reduce write and erase times.

SUMMARY OF THE INVENTION

The invention is founded upon the critical observation that efficient profiling of impurity dopants in the channel, source and drain regions are useful to assist in transferring electrons between a floating gate and the underlying substrate of a nonvolatile CMOS memory cell. In this regard, in a CMOS memory cell with a floating gate, the concentration of dopant in each of the source, drain and channel regions exhibits an increasing level in a widthwise direction from an initial level at an initial location. Typically the increase is generally exponential. The effect is to create a built-in field which increases in the direction of the surface of the semiconductor substrate and toward the edge of the channel region. This variation yields relatively high diffusion current densities accelerated to the surface and directed to the vicinity of the channel/drain interface. The effect is enhanced by reduction in gate oxidation thickness over the channel in the vicinity of the drain, which brings a portion of the floating gate spanning the drain and a portion of the channel abutting the drain relatively close to the surface of the semiconductor substrate. This creates a tunnel "window" in precisely the area where the magnitude of the electric field set up by the concentration profile is greatest. Carriers are accelerated from an inversion portion in the center of the channel region in the direction of the edges of the channel and the tunnel "windows." Acceleration translates into "hot" electrons entering the neighborhood of the tunnel windows, which generate additional carriers due to impact ionization. With the application of appropriate operating voltages to a cell so constructed, write times are significantly reduced in comparison to conventional devices.

The invention is summarized as a semiconductor memory device which includes a semiconductor substrate of a first conductivity type, the substrate having a top and a bottom surface. First and second regions of a second conductivity type are formed in the top surface of the semiconductor substrate and these first and second regions are spaced apart in a first direction corresponding to the X axis of a set of three orthogonal axes, X, Y and Z. A channel region is formed in the top surface of the substrate and extends along the first direction between the first and second regions. The channel region has a length measured between the first and second regions along the X axis, a depth measured in the second direction extending from the top towards the bottom surface of the substrate along the Y axis, and a width measured in a third direction on the top surface along the Z axis. The device includes a control gate formed on the substrate over the channel region. The channel region includes first conductivity-determining dopant impurities in the semiconductor substrate which have a concentration profile that increases in a direction parallel to the Z axis from an initial point on a line substantially widthwise-centered in the channel region. The first and second regions include second conductivity-determining dopant impurities in the semiconductor substrate which have a concentration profile that increases in a direction parallel to the Z axis from an initial point on an extension of the channel center line.

The increase in the concentration profile may be at a regular or irregular rate. Typically the profile will increase approximately exponentially. For purposes of making theoretical calculations, one can represent the profile increase by an exponential function.

The invention herein is applicable to both electron-type and hole-type semiconductors. However, while only the former are currently utilized and the description herein is with respect to the former, it will be understood that the latter are intended to be encompassed within the scope of this invention when they become available. Thus, preferentially the first conductivity type is p-type conductivity and the second conductivity type is n-type conductivity.

The device of this invention also includes a floating gate formed on the substrate between the control gate and the channel region. The floating gate has a first portion extending over the channel region, which is separated from the top surface of the substrate by a first distance. The first portion of the floating gate transitions to a tunnel portion over the channel region in the vicinity of the first region. The tunnel portion extends over the first region and a portion of the channel region abutting the first region, and is separated from the surface of the substrate by a second distance less than the first distance.

An objective of this invention is therefore to provide a non-volatile PROM in a CMOS structure with a floating gate and source, drain and channel regions characterized in having widthwise, exponentially increasing dopant profiles in the three regions.

A second objective is to provide such a device having a floating gate with a tunnel window region that extends over a portion of the channel region and the source or drain region.

A reading of the following description with reference to the below-described drawings will provide an understanding of how these objectives and other attendant advantages are realized in this invention.

DESCRIPTION OF THE PREFERRED EMBODIMENTS

Figure 1:
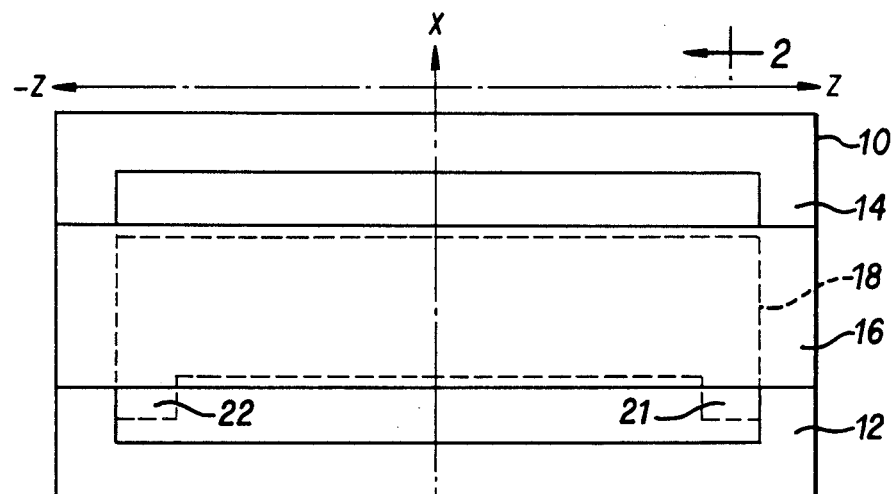
FIG. 1 is a greatly enlarged plan view illustrating a non-volatile memory cell constructed according to the invention.
Figure 2:
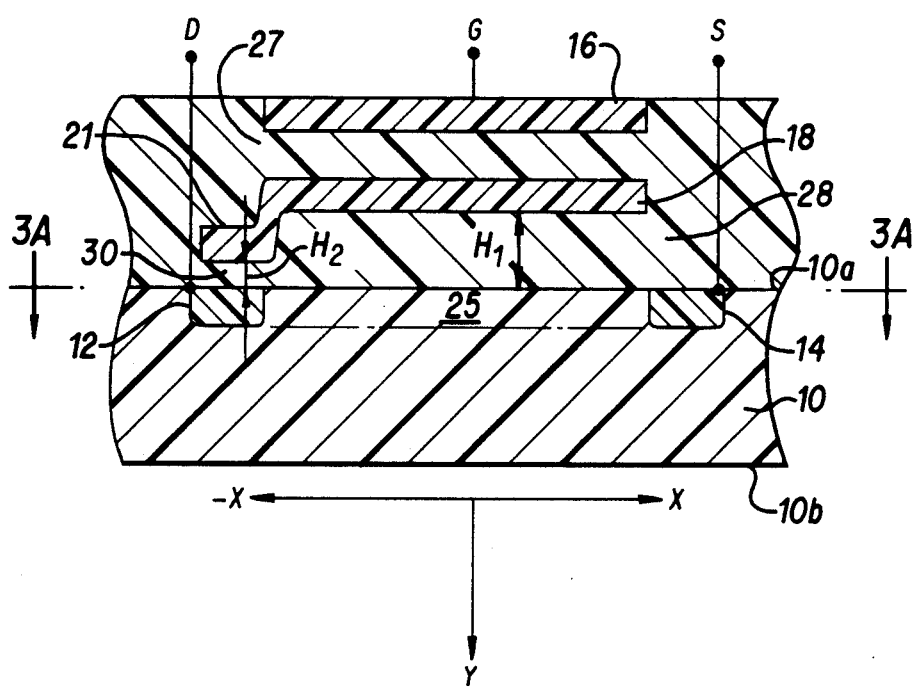
FIG. 2 is a greatly enlarged sectional elevation view of a portion of the memory cell illustrated in FIG. 1 showing the physical structure of the cell of the invention.

The configuration of a CMOS memory cell of this invention will be described, first, with respect to FIGS. 1 and 2. FIG. 1 is a greatly expanded planar view of a semiconductor wafer, which is doped with impurities to make it p-conducting. As shown in FIGS. 1 and 2, the wafer includes a semiconductor substrate 10 having a top surface 10a and a bottom surface 10b. Regions 12 and 14 are formed in the upper surface 10a of the substrate by implantation of n-type impurity dopants. Implantation is by a conventionally-controlled process which drives impurities through the surface 10a in the direction of the lower surface 10b. The region 12 is denoted as the drain region, the region 14 as the source region. A polysilicon control gate 16 is formed to overlay the upper surface 10a of the substrate and to span the region between the source and drain 12 and 14. A floating gate 18 is sandwiched between the control gate 16 and the upper surface 10a of the substrate. The floating gate 18 includes a pair of tunnel regions 21 and 22. As seen most clearly in FIG. 2, a cross section of the substrate taken along line 2—2 of FIG. 1, a channel region 25 of the substrate is defined by the source and drain regions, 12 and 14. The control gate 16 is separated from the floating gate 18 by a first oxide layer 27. The floating gate 18 is separated from the upper surface 10a by a second gate oxide layer 28. With reference to FIG. 2, the gate oxide layer 28 has a first height $H_1$ between the undersurface of the floating gate 18 and the upper surface 10a of the semiconductor substrate 10 over most of the channel region 25. At the tunnel regions 21 (and 22) of the floating gate, the field oxide 28 transitions from the first height $H_1$ to a second height $H_2$ wherein $H_2$ is substantially less than $H_1$. As seen also in FIG. 2, each of the tunnel regions 21 and 22 spans a portion of the drain 12 and a portion of the channel region 25 which abuts the drain 12.

In FIGS. 1 and 2, a set of three orthogonal axes X, Y and Z are useful for defining various dimensions and characteristics of the memory cell. The X dimension extends between the drain and source 12 and 14; the length of the channel region 25 is measured along this axis. The Y axis is directed from the control gate 16 through the upper and lower surfaces 10a and 10b of the substrate. The height of the substrate, and of the completed memory cell is measured along this dimension. The Z axis is shown in FIG. 1 as extending between the sides of the semiconductor substrate 10; it is along this axis that the width of the channel, drain and source regions are measured.

The materials and processes for constructing the memory cell of this invention according to FIGS. 1 and 2 are well known in the art. In this regard, the substrate 10 is doped, in the Y direction, with, for example, boron to establish intrinsic p-type conductivity, while the drain and source are formed by doping the intrinsic semiconductor substrate in the Y direction with arsenic impurities to establish (n+)-conductivity. The oxide layers 27, 28 and 30 are formed conventionally by growth of silicon dioxide, while the control and floating gates 16 and 18 comprise polysilicon.

A CMOS fabrication process is used to form the structures illustrated in FIGS. 1 and 2, employing the materials described above.

Figure 3A:
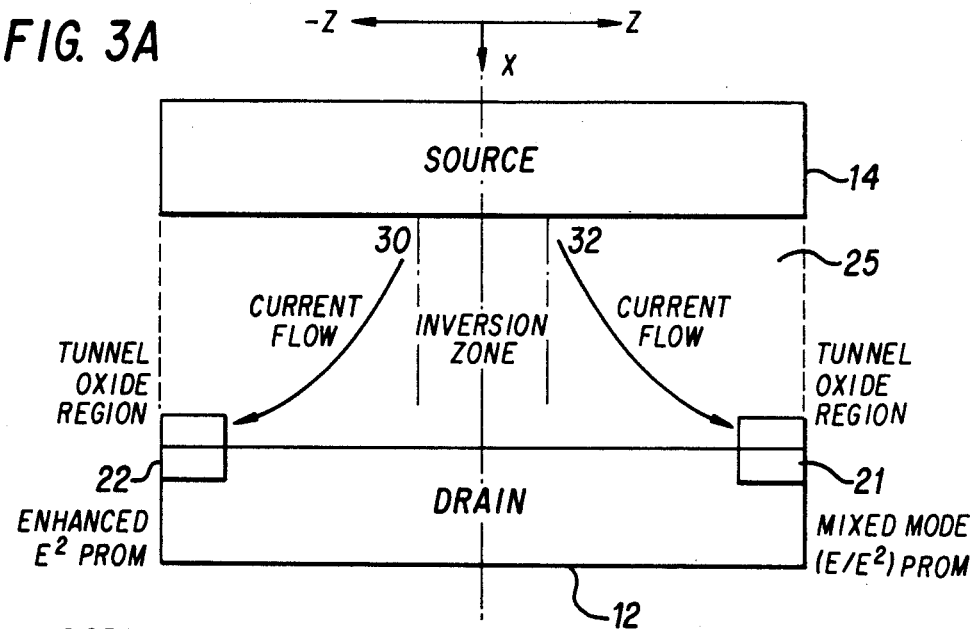
FIG. 3A a planar view of FIG. 1 modified to illustrate an inversion zone and the direction of current flow in the channel region of a cell according to the invention.
Figure 3B:
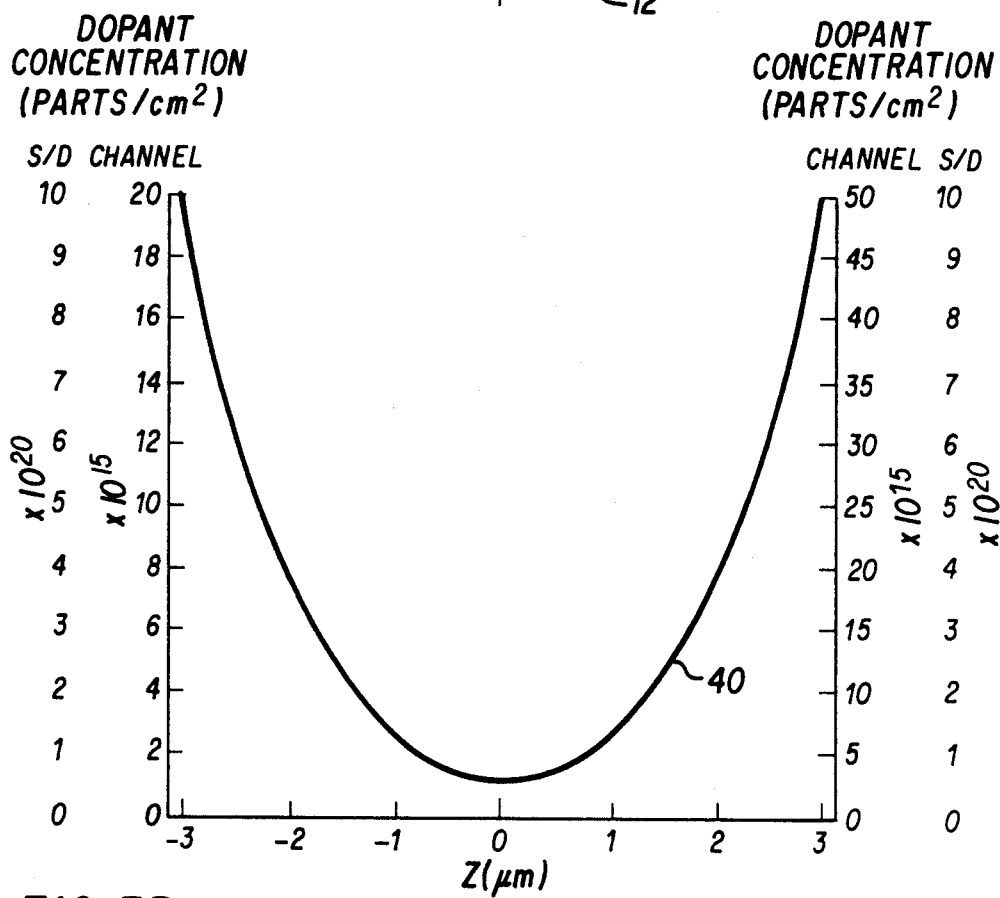
FIG. 3B illustrates the dopant concentration profile in the source, drain and channel regions of the cell illustrated in FIG. 3A, with dopant concentrations selected to exhibit EEPROM operation, and a mixed mode operation which combines EPROM and EEPROM operations.

FIGS. 3A and 3B illustrate two views of the memory cell invention. FIG. 3A is the planar view of FIG. 1 with the top of the memory cell of FIG. 1 removed along the lines 3A—3A of FIG. 2. FIG. 3B is a positively-sloped curve 40. The curve 40 represents the dopant profile of the channel, drain and source regions in respective Z-Y planes of the regions. The curve of FIG. 3B represents a section of the memory cell of FIG. 3A taken in the direction of the Y axis anywhere along the channel region, or within the drain or source regions.

For the purposes of the representative calculations and this example the curve illustrated is exponential, but other profiles could produce different regular or irregular curves. The profile curve 40 rises from a point corresponding to, or parallel to the center line of the channel region, the center line being parallel to the X axis. The curve 40 represents the dopant profile of the channel, drain or source region width-wise; that is in the direction of the Z axis. As is evident from an inspection of FIG. 3B, the width of the channel region, and of the drain and source regions, is assumed to be 6 microns (for example). Two representative dopant profiles are shown, one on the left-hand side of the curve of FIG. 3B, the other on the right-hand side. On the left-hand side, the profile of dopant impurities within the channel varies from an initial value of $0.5 \times 10^{15}$ to $20 \times 10^{15}$ parts/$cm^3$. The drain and source dopant concentration varies from $0.5 \times 10^{20}$ to $10 \times 10^{20}$ parts/$cm^3$. On the right-hand side, the drain and source dopant concentration profile is unchanged from the left-hand side; however, the channel dopant profile varies from $2.5 \times 10^{15}$ to $50 \times 10^{15}/cm^3$. (It will be understood that these values are merely illustrative and that the actual values for any particular semiconductor will be determined by routine experimentation.

The FIGS. 3A and 3B illustrate a device in which the dopant profile concentrations in turn define an electric field in each of the regions, whose Z component has a magnitude given by equation (1):

$$|E_z| = |\S\Psi/\S z| = \alpha \phi(x,y) \exp(+\alpha|z|) \quad (1)$$

where the three-dimensional potential in the channel, drain or source region is given by equation (2):

$$\psi(x,y,z) = \phi(x,y)\exp(+\alpha|z|) \quad (2)$$

and where an approximate expression for the particular solution to $\phi(x,y)$ equals:

$$\phi(x,y) = -c_{Si}\eta(x,y)/\alpha^2$$

for which $C_{Si} = 1/\epsilon_{Si}$ and $\epsilon_{Si}$ denotes the permittivity constant of silicon.

The implication of equation (1) is that the magnitude of the Z component of the electric field in the channel, drain and source regions can be brought to the breakdown value with relatively small applied gate and drain voltages, whose values will depend upon the value of the slope $[\alpha]$.

Further to be understood in view of equation (1) is that the Z component of the electrical field in the channel region 25 with a dopant concentration profile starting from a relatively low dopant level will create a rather narrow inversion zone centered widthwise in the channel and extending between the source and drain regions 14 and 12. Now, because of the exponential increase of the dopant density across the width of the channel, a concomitant exponential increase in the electrical field toward the edges of the channel creates a gradient of carrier density that increases exponentially toward the edges of the regions 12, 14 and 25. This exponential variation yields high diffusion current densities which are directed, by the exponentially increasing field, from the inversion zone toward the edges of the regions. Furthermore, the diffusion current will be accelerated to the top surface 10a near the substrate-oxide interface and directed to the vicinity of the tunnel windows 21 and 22 of the floating gate because of the electric field distribution and magnitude. The net direction of current flow is represented by lines 30, 32. This acceleration translates into "hot" current entering the neighborhood of the tunnel windows 21 and 22, the hot carriers generating additional current in these vicinities due to impact ionization. The acceleration of carriers in the vicinity of the tunnel windows and the generation of additional carriers by impact ionization with the accelerated carriers increases the rate of injection through the tunnel windows 21 and 22. The rate of injection is increased over that which can be achieved in the conventional EPROM without tunneling, and also over that which is achieved in conventional EEPROM with tunneling only between the drain and the floating gate. Therefore, either of the prior art PROMs enjoys increased injection by virtue of carrier acceleration due to an exponentially increasing Z component of the device electrical field.

The portions of the tunnel windows 21 and 22 which overly the channel region in the vicinity of the drain enhance the rate of conventional carrier injection from the channel to the floating gate by provision of a capacity for tunneling in these portions of the channel region. The association of the largest field magnitudes with the source and drain neighborhoods of the channel and the location of those magnitudes near the top surface 10a of the substrate mean that the direction of the field and its magnitude favor its highest electron densities to be near the source or drain and close to the substrate/oxide interface.

An unexpected benefit of the dopant concentration profiling and the tunnel window portions of the floating gate is to increase the rate and efficiency of injection of carriers into the floating gate during write conditions, which occur with application of the appropriate voltages to the control gate 16 and drain 12.

The left-hand side axis of FIG. 3B forms the basis for an enhanced EEPROM in which the operating voltages applied to the control gate and drain are chosen such that only a very narrow inversion zone is formed in the center of the channel region. Because of the built-in fields described above, the current flow tends toward either corner of the drain region where the tunnel windows are placed. The current contributes to the current density tunneling through the gate oxide and reduces the write time.

The right-hand axis of FIG. 3B establishes a dopant concentration profile underpinning a mixed mode E/EEPROM. Because the built-in field magnitudes are selected to be close to the breakdown value, this mixed mode of operation arises because the field magnitudes are close to the breakdown value over a large portion of the channel width. With the dopant concentration values displayed on the right-hand side of FIG. 3B, the magnitudes of these fields are very large when the absolute value of the width is greater than or equal to 2 micrometers. In this case, electrons will be accelerated and gain sufficient energy to traverse the oxide barrier into the floating gate. At the same time, thermal electrons in the drain region tunnel through the oxide. This dual mode of injecting charge into the floating gate provides a write time which is even less than that for the enhanced EEPROMs described above.

When the device of FIGS. 1, 2 and 3A is operated as an EPROM, the built-in fields are sufficiently large to assist the electrons injected into the channel region in gaining sufficient energy to traverse the oxide barrier between substrate surface 10A and the floating gate.

Operational extremes of the device of the invention are represented by the EEPROM and EPROM modes described above. The mixed mode operation is possible with a careful choice of control gate and drain voltages.

An artifact of operation of the device of this invention to be considered in its application is the fact that the device is partially turned on. In this regard, along with the application of the drain voltage, a small residual current will be manifested due to the diffusion of carriers from the inversion in the center of the channel to the edges of the channel toward the drain.

The read and erase operations for the device of this invention are comparable to those for prior art devices. However, when the device is being written, a control gate signal of voltage high enough to create the inversion region in the center of the channel is applied. Voltage will be slightly higher than for conventional EEPROM writing, however, it will be substantially lower than the gate voltage necessary to write an EPROM. Therefore, the major advantage gained by the invention is a substantial increase in the speed with which the devices of this invention are written, the write speed being greater than that for a conventional EEPROM or EPROM.

Obviously many modifications of this invention may be practiced without parting from its scope and spirit, and the invention is therefore to be limited solely by the appended claims.

We claim:

1. A semiconductor memory device, comprising:
a semiconductor substrate of a first conductivity type, said semiconductor substrate having top and bottom surfaces;
first and second regions of a second conductivity type formed in the top surface of said semiconductor substrate;
said first and second regions being spaced apart in a first direction, said first direction corresponding to the X axis of a set of three orthogonal axes, X, Y, and Z;
a channel region formed in said substrate and extending along said first direction between said first and second regions, said channel region having a length measured between said first and second regions along said X axis, a depth measured in a second direction extending from the top toward the bottom surface of said semiconductor substrate along said Y axis, and a width measured in a third direction in said top surface along said Z axis; and
a control gate formed on said substrate over said channel region;
said channel region including first conductivity-determining dopant impurities in said semiconductor substrate and having a concentration profile which increases in a direction parallel to said Z axis from an initial point on a line substantially widthwise-centered in said channel region; and
said first and second regions each including second conductivity-determining dopant impurities in said semiconductor substrate and having a concentration profile which increases exponentially in a direction parallel to said Z axis from an initial point on an extension of said line.

2. A device as in claim 1 wherein said first conductivity type is p-type conductivity and said second conductivity is n-type conductivity.

3. A device as in claim 1 wherein said concentration profile increases generally exponentially.

4. A semiconductor memory device, including
a semiconductor substrate of a first conductivity type;
first and second regions of a second conductivity type formed in a surface of said semiconductor substrate; and
said first and second regions being spaced apart in a first direction, said first direction corresponding to the X axis of a set of three orthogonal axes, X, Y, and Z;
a channel region formed in said substrate and extending along said first direction between said first and second regions, said channel region having a length measured between said first and second regions along said X axis, a depth measured in a second direction extending from the top toward the bottom surface of said semiconductor substrate along said Y axis, and a width measured in a third direction in said top surface along said Z axis;
a control gate formed on said substrate over said channel region;
said channel region including first conductivity-determining dopant impurities in said semiconductor substrate and having a concentration profile which increases in a direction parallel to said Z axis from an initial point on a line substantially widthwise-centered in said channel region;
said first and second regions each including second conductivity-determining dopant impurities in said semiconductor substrate and having a concentration profile which increases exponentially in a direction parallel to said Z axis from an initial point on an extension of said line;
a control gate formed on said substrate over said channel region;
a floating gate formed in said substrate between said control gate and said channel region, said floating gate having a tunnel portion in the vicinity of said first region, said tunnel portion extending over said first region and a portion of said channel region abutting said first region;
said channel region including first conductivity-determining dopant impurities in said semiconductor substrate and having a concentration profile which increases exponentially in a direction parallel to said Z axis from an initial point on a line substantially widthwise-centered in said channel region; and
said first and second regions each including second conductivity-determining dopant impurities in said semiconductor substrate and having a concentration profile which increases exponentially in a direction parallel to said Z axis from an initial point on an extension of said line.

5. A device as in claim 4 wherein said first conductivity type is p-type conductivity and said second conductivity type is n-type conductivity.

6. A device as in claim 4 wherein said concentration profile increases generally exponentially.

7. A semiconductor memory device, comprising:
a semiconductor substrate of a first conductivity type, said semiconductor substrate having top and bottom surfaces;
first and second regions of a second conductivity type formed in the top surface of said semiconductor substrate;

said first and second regions being spaced apart in a first direction, said first direction corresponding to the x axis of a set of three orthogonal axes, X, Y, and Z;

a channel region formed in said substrate and extending along said first direction between said first and second regions, said channel region having a length measured between said first and second regions along said X axis, a depth measured in a second direction extending from the top toward the bottom surface of said semiconductor substrate along said Y axis, and a width measured in a third direction in said top surface along said Z axis;

a control gate formed on said substrate over said channel region;

a floating gate formed in said substrate between said control gate and said channel region, said floating gate having a tunnel portion in the vicinity of said first region, said tunnel portion extending over said first region and a portion of said channel region abutting said first region;

said channel region including first conductivity-determining dopant impurities in said semiconductor substrate and having a concentration profile which increases exponentially in a direction parallel to said Z axis from an initial point on a line substantially widthwise-centered in said channel region; and said first and second regions each including second conductivity-determining dopant impurities in said semiconductor substrate and having a concentration profile which increases exponentially in a direction parallel to said Z axis from an initial point on an extension of said line.

8. A device as in claim 7 wherein said first conductivity type is p-type conductivity and said second conductivity type is n-type conductivity.

9. A device as in claim 7 wherein said concentration profile increases generally exponentially.

* * * * *